United States Patent
Recio et al.

(10) Patent No.: US 10,936,125 B2
(45) Date of Patent: Mar. 2, 2021

(54) CAPACITIVE TOUCH SENSORS AND METHODS OF OPERATING CAPACITIVE TOUCH SENSORS

(71) Applicant: Haier US Appliance Solutions, Inc., Wilmington, DE (US)

(72) Inventors: Steven Michael Recio, Louisville, KY (US); Stuart Ian Gross, Jr., Louisville, KY (US); Alexis Christina Taylor, Louisville, KY (US); Christopher Lawrence Beeler, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 0 days.

(21) Appl. No.: 15/790,204

(22) Filed: Oct. 23, 2017

(65) Prior Publication Data

US 2019/0121461 A1 Apr. 25, 2019

(51) Int. Cl.
| G06F 3/044 | (2006.01) |
| F25D 29/00 | (2006.01) |
| G06F 3/0484 | (2013.01) |
| H05B 1/02 | (2006.01) |
| H03K 17/96 | (2006.01) |
| F25D 23/12 | (2006.01) |

(52) U.S. Cl.
CPC ............ *G06F 3/044* (2013.01); *F25D 23/126* (2013.01); *F25D 29/005* (2013.01); *G06F 3/04847* (2013.01); *H03K 17/9622* (2013.01); *H05B 1/0266* (2013.01); *F25D 2400/361* (2013.01); *G06F 2203/04107* (2013.01); *H03K 2217/960705* (2013.01); *H03K 2217/960765* (2013.01)

(58) Field of Classification Search
CPC ..................... G06F 3/044; G06F 3/041; G06F 2203/04107; H03K 17/96; H03K 2217/960765; F24C 7/083; F25D 2400/361; H05B 1/0263; H05B 1/0266
See application file for complete search history.

(56) References Cited

U.S. PATENT DOCUMENTS

| 8,717,331 | B2 | 5/2014 | Kremin et al. |
| 8,773,146 | B1* | 7/2014 | Hills ....................... G06F 3/041 |
| | | | 324/658 |
| 8,902,172 | B2 | 12/2014 | Peng et al. |

(Continued)

OTHER PUBLICATIONS

Cypress Semiconductor, Getting Started with CapSense, Document No. 001-64846 Rev. *V, 1-129.

*Primary Examiner* — Priyank J Shah
(74) *Attorney, Agent, or Firm* — Dority & Manning, P.A.

(57) ABSTRACT

A method of operating a capacitive touch sensor, the capacitive touch sensor including an electrode, includes monitoring raw count data from the capacitive touch sensor and recording a first value of the raw count data when the raw count data exceeds a first threshold. The method also includes supplying a driven shield signal to the electrode after the raw count data exceeds the first threshold and recording a second value of the raw count data while supplying the driven shield signal to the electrode. The method further includes calculating a difference between the first value and the second value and registering a touch when the calculated difference between the first value and the second value is less than a second threshold.

19 Claims, 8 Drawing Sheets

(56) References Cited

U.S. PATENT DOCUMENTS

| | | | |
|---|---|---|---|
| 2008/0111714 A1* | 5/2008 | Kremin | H03M 11/02 |
| | | | 341/33 |
| 2008/0136792 A1* | 6/2008 | Peng | G06F 3/04186 |
| | | | 345/174 |
| 2008/0196945 A1* | 8/2008 | Konstas | G06F 3/0443 |
| | | | 178/18.03 |
| 2011/0253693 A1* | 10/2011 | Lyons | A47J 27/00 |
| | | | 219/209 |
| 2012/0050214 A1* | 3/2012 | Kremin | G06F 3/0418 |
| | | | 345/174 |
| 2014/0014084 A1* | 1/2014 | Rudolph | F24C 7/08 |
| | | | 126/1 R |
| 2014/0022207 A1* | 1/2014 | Shimizu | G06F 3/0418 |
| | | | 345/174 |
| 2015/0363632 A1* | 12/2015 | Ahn | G06F 3/04166 |
| | | | 382/124 |
| 2016/0087629 A1* | 3/2016 | Nishiyama | G01R 27/26 |
| | | | 200/17 R |
| 2016/0259468 A1* | 9/2016 | Huang | G06F 3/044 |
| 2017/0023255 A1* | 1/2017 | Bach | F24C 7/083 |
| 2017/0031475 A1* | 2/2017 | Doering | F25D 29/005 |
| 2017/0131841 A1* | 5/2017 | Chang | G06F 3/0418 |
| 2017/0328630 A1* | 11/2017 | Hwang | F25D 23/126 |
| 2018/0121002 A1* | 5/2018 | Kim | H01L 27/323 |
| 2018/0292977 A1* | 10/2018 | Pinder | H04W 4/90 |
| 2018/0335872 A1* | 11/2018 | Vinje | G06F 3/04186 |

\* cited by examiner

| EVENT RAW COUNT DATA | FINGER EVENT | WATER EVENT |
|---|---|---|
| SHIELD ACTIVE | 326.67 | 109.00 |
| SHIELD LOW | 321.67 | 166.67 |
| DIFFERENCE | 5.00 | 57.67 |

CAPACITIVE TOUCH SENSORS AND METHODS OF OPERATING CAPACITIVE TOUCH SENSORS

FIELD

The present subject matter relates generally to capacitive touch sensors, such as may be used in control panels for appliances.

BACKGROUND

Appliances generally include a control panel having a plurality of buttons, keys, or other input devices. Utilizing the control panel, an appliance user can input control commands to the appliance and operate the appliance. Certain control panels include capacitive touch sensors that utilize a user's body capacitance to operate. In particular, capacitive touch sensors can detect a change in capacitance when the user touches the control panel.

Capacitive touch sensors have various benefits. For example, capacitive touch sensors can assist with providing a clean appearance for an associated appliance. In particular, capacitive touch sensors are frequently positioned behind a dielectric panel. A user touches an outer surface of the dielectric panel opposite the capacitive touch sensors to actuate the capacitive touch sensors. The smooth outer surface can have a pleasant cosmetic appearance, e.g., particularly compared to tactile buttons, knobs, etc.

Some capacitive touch sensors can register a "false touch," e.g., when something other than the user touches the outer surface of the dielectric panel such capacitive touch sensors may be actuated in an undesirable manner. For example, water or other liquids splashed or spilled on the control panel may cause capacitive touch sensors of the control panel to register a false touch. To prevent such false touches, capacitive touch sensors may include a driven shield. A capacitive touch sensor with a driven shield includes at least one layer of a printed circuit board connected to a controller where the controller provides a driven shield signal to the at least one layer of the printed circuit board. Thus, the at least one layer of the printed circuit board may be referred to as a shield electrode. However, the driven shield signal may introduce challenges for radiated emissions compliance.

Accordingly, capacitive touch sensors that include features for preventing false touch detection while also minimizing radiated emissions would be useful.

BRIEF DESCRIPTION

Aspects and advantages of the technology will be set forth in part in the following description, or may be apparent from the description, or may be learned through practice of the technology.

In an exemplary embodiment, an appliance is provided. The appliance includes a user interface assembly. The user interface assembly includes a capacitive touch sensor and the capacitive touch sensor has an electrode. The appliance also includes a controller in operative communication with the user interface assembly. The controller is configured to monitor raw count data from the capacitive touch sensor, record a first value of the raw count data when the raw count data exceeds a first threshold, and supply a driven shield signal to the electrode after the raw count data exceeds the first threshold. The controller is further configured to record a second value of the raw count data while supplying the driven shield signal to the electrode and calculate a difference between the first value and the second value. The controller is configured to register a touch when the calculated difference between the first value and the second value is less than a second threshold.

In another exemplary embodiment, a method of operating a capacitive touch sensor is provided. The capacitive touch sensor includes an electrode. The method includes monitoring raw count data from the capacitive touch sensor and recording a first value of the raw count data when the raw count data exceeds a first threshold. The method also includes supplying a driven shield signal to the electrode after the raw count data exceeds the first threshold and recording a second value of the raw count data while supplying the driven shield signal to the electrode. The method further includes calculating a difference between the first value and the second value and registering a touch when the calculated difference between the first value and the second value is less than a second threshold.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures.

DETAILED DESCRIPTION

Reference now will be made in detail to embodiments of the technology, one or more examples of which are illustrated in the drawings. Each example is provided by way of explanation of the technology, not limitation of the technology. In fact, it will be apparent to those skilled in the art that various modifications and variations can be made in the present technology without departing from the scope or spirit of the technology. For instance, features illustrated or described as part of one embodiment can be used with another embodiment to yield a still further embodiment. Thus, it is intended that the present technology covers such modifications and variations as come within the scope of the appended claims and their equivalents.

Figure 1:
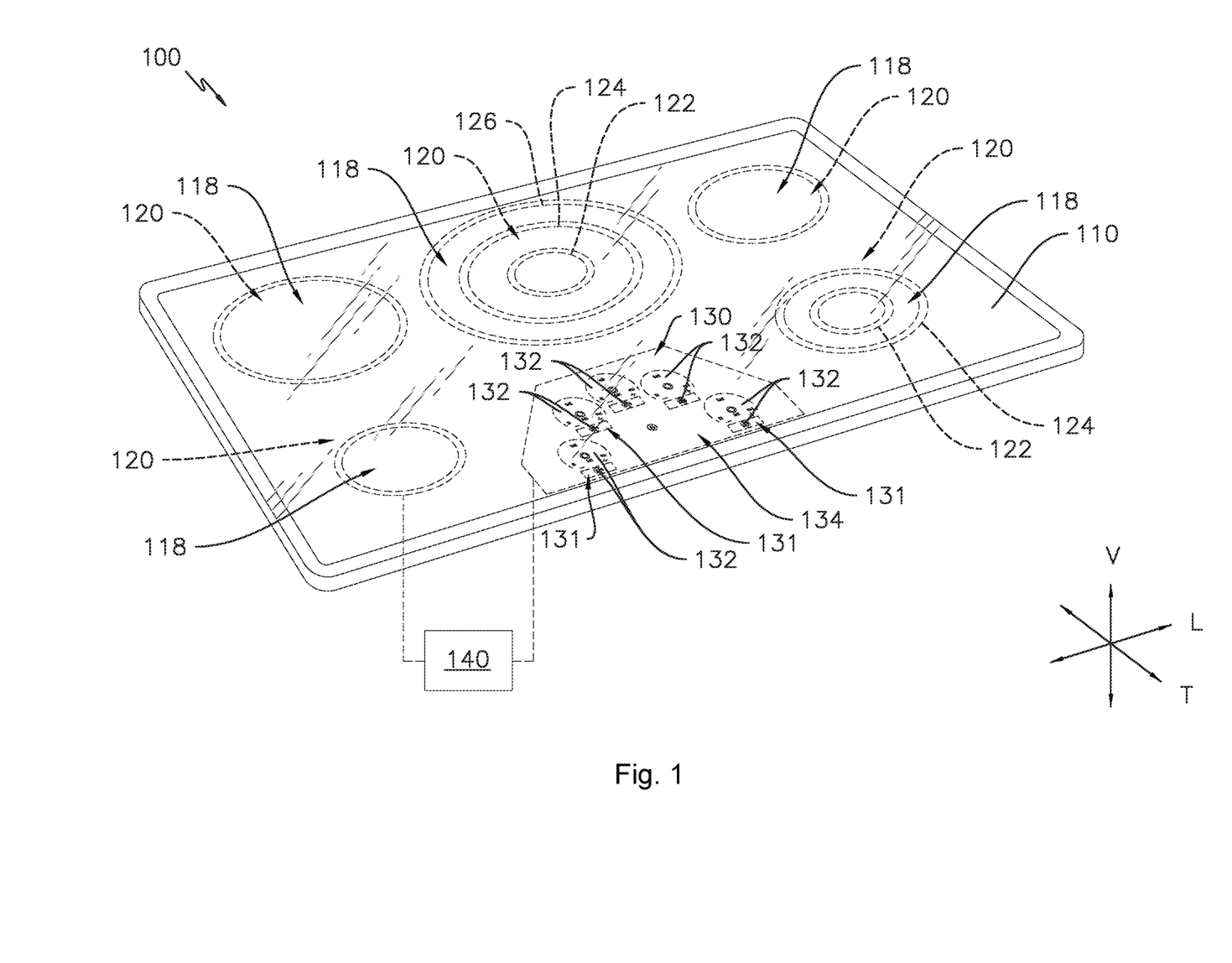
FIG. 1 provides a top perspective view of a cooktop appliance as may incorporate a capacitive touch sensor in accordance with at least one embodiment of the present subject matter.

FIG. 1 provides a top, perspective view of a cooktop appliance 100 according to an exemplary embodiment of the present subject matter. Cooktop appliance 100 can be installed in various locations such as in cabinetry in a kitchen, with one or more ovens to form a range appliance, or as a standalone appliance. Thus, as used herein, the term "cooktop appliance" includes grill appliances, stove appliances, range appliances, and other appliances that incorporate cooktops, which are generally known as surface cooking appliances. It should be understood that the present disclosure is not limited to cooktop appliances 100, and rather that any suitable appliance having a user input assembly is within the scope and spirit of the present disclosure.

Cooktop appliance 100 includes a cooking panel 110 for supporting cooking utensils such as pots or pans thereon. Cooking panel 110 is a generally transparent material that may be constructed from, e.g., glass, ceramics, and/or combinations thereof.

Cooking panel 110 may include one or more cooking zones 118. As shown in FIG. 1, cooking zones 118 may be generally circular in shape and may have various diameters. For example, each cooking zone 118 can have a different diameter, the same diameter, or any suitable combination thereof. In other embodiments, cooking zones 118 may be generally rectangular in shape, and each cooking zone 118 may have the same length and width, a different length and width, or any suitable combination thereof. In still other embodiments, cooking zones 118 may have any suitable shape and size, and in some embodiments, cooking panel 110 may include cooking zones 118 of various shapes and sizes, e.g., a combination of circular and rectangular cooking zones 118. Further, while shown with five cooking zones 118 in the exemplary embodiment of FIG. 1, in alternative exemplary embodiments, cooktop appliance 100 may include any number of cooking zones 118.

A heating assembly 120 is mounted below cooking panel 110 adjacent each cooking zone 118 such that heating assemblies 120 are positioned below cooking panel 110, e.g., along a vertical direction V. Each heating assembly 120 may comprise a single heating element or a plurality of heating elements or sub-elements, such as a first heating element 122, a second heating element 124, and/or a third heating element 126 as shown in FIG. 1, with each heating element or sub-element contributing to the power density of the respective cooking zone 118. For each heating assembly having more than one heating element, heating elements 122, 124, and/or 126 may be activated individually or in conjunction with one or both of the other heating elements 122, 124, 126. For example, for a given heating assembly 120, first heating element 122 may be activated individually, with second heating element 124, with third heating element 126, or with both second heating element 124 and third heating element 126. As an additional example, for a heating assembly 120 comprising two heating elements, such as first heating element 122 and second heating element 124, both heating elements 122, 124 may be activated individually or simultaneously. Thus, using heating assemblies 120 having multiple heating elements, cooking zones 118 may vary in size and/or power density.

Cooktop appliance 100 is provided by way of example only and is not limited to the exemplary embodiment shown in FIG. 1. For example, a cooktop appliance having one or more heating assemblies in combination with one or more electric or gas burner heating elements can be provided. In addition, various combinations of number of heating assemblies, position of heating assemblies, and/or size of heating assemblies can be provided. Moreover, heating assemblies 120 can have a variety of constructions for the input of energy in the form of heat to the cooking utensils. For example, heating assemblies 120 can be constructed as electric radiant or gas-on-glass heating sources. Mechanisms associated with each such type of heating source are positioned under cooking panel 110 adjacent cooking zones 118 and will be well understood of one of skill in the art using the teachings disclosed herein.

A touch pad or touch screen 130 provides visual information to a user and allows a user to select various options for the operation of cooktop appliance 100. For example, touch screen 130 may include a selection portion 131 for each cooking zone 118, and within selection portion 131, a user may select which heating element or elements of the associated heating assembly 120 the user desires to be activated and information may be displayed to the user such as, e.g., which heating element or elements is active and/or at what size or power density has been selected for cooking zone 118. The selection portion 131 may include one or more user input components. More particularly, as shown in the exemplary embodiment of FIG. 1, the user input component(s) of touch screen 130 may be one or more capacitive touch input components 132, which can be used as part of a capacitive touch sensing system 171 (FIG. 2) to allow for the selective activation, adjustment, or control of any or all heating assemblies 120. Touch input components 132 may also be provided for the selective activation, adjustment, or control of any timer features or other user adjustable inputs. One or more of a variety of electrical, mechanical or electro-mechanical input devices including rotary dials, push buttons, toggle/rocker switches, and/or touch pads can also be used singularly or in combination with touch input components 132. Touch screen 130 also includes a display component 134, such as a digital or analog display device designed to provide operational feedback to a user. Selection portion 131 of touch screen 130 is further described below.

Touch screen 130 can be any type of input device and can have any configuration. In FIG. 1, touch screen 130 is located within a portion of cooking panel 110. Alternatively, touch screen 130 can be positioned on a vertical surface near a front side of cooktop appliance 100 or anywhere convenient for a user to access during operation of cooktop appliance 100. In some embodiments, cooktop appliance 100 may be a range cooktop, and in such embodiments, touch screen 130 may be positioned on, e.g., a backsplash of the range.

Also, although described with respect to cooktop appliance 100, it should be readily understood that touch screen 130 as described herein could be used with any suitable appliance. When used with other appliances, such as, e.g., washing machine appliances, dryer appliances, and/or refrigerator appliances, panel 110 may be constructed of glass, ceramics, plastics, and/or combinations thereof. Suitable plastic materials may include acrylics, polyethylene terephthalate ("PET"), or the like. In some embodiments, touch screen 130 may be incorporated into or may form the control panel of an appliance; for example, touch screen 130 may be incorporated into a backsplash of a washing machine or dryer appliance.

Operation of cooktop appliance 100 can be regulated by a controller 140 that is operatively coupled, i.e., in communication with, touch screen 130 and heating assemblies 120, including first heating elements 122, second heating elements 124, and third heating elements 126. For example, in response to user manipulation of a touch input component 132, the controller operates one of heating assemblies 120, e.g., by operating one or more of heating elements 122, 124, 126. The controller is also provided with other features. By way of example, the controller may include a memory and one or more processing devices such as microprocessors, CPUs or the like, such as general or special purpose microprocessors operable to execute programming instructions or micro-control code associated with operation of appliance 100. The memory may represent random access memory such as DRAM, or read only memory such as ROM or FLASH. The memory may be a separate component from the processor or may be included onboard within the processor. In one embodiment, the processor executes programming instructions stored in memory. It should be noted that controllers 140 as disclosed herein are capable of and may be operable to perform any methods and associated method steps as disclosed herein. For example, in some embodiment, methods disclosed herein may be embodied in programming instructions stored in the memory and executed by the controller 140.

The controller 140 may be positioned in a variety of locations throughout cooktop appliance 100. In the illustrated embodiment, the controller may be located under or next to the touch screen 130. In such an embodiment, input/output ("I/O") signals are routed between the controller and various operational components of appliance 100 such heating assemblies 120, touch input components 132, sensors, graphical displays, and/or one or more alarms. In one embodiment, the touch screen 130 may represent a general purpose I/O ("GPIO") device or functional block. Touch screen 130 may be in communication with the controller via one or more signal lines or shared communication busses.

Figure 2:
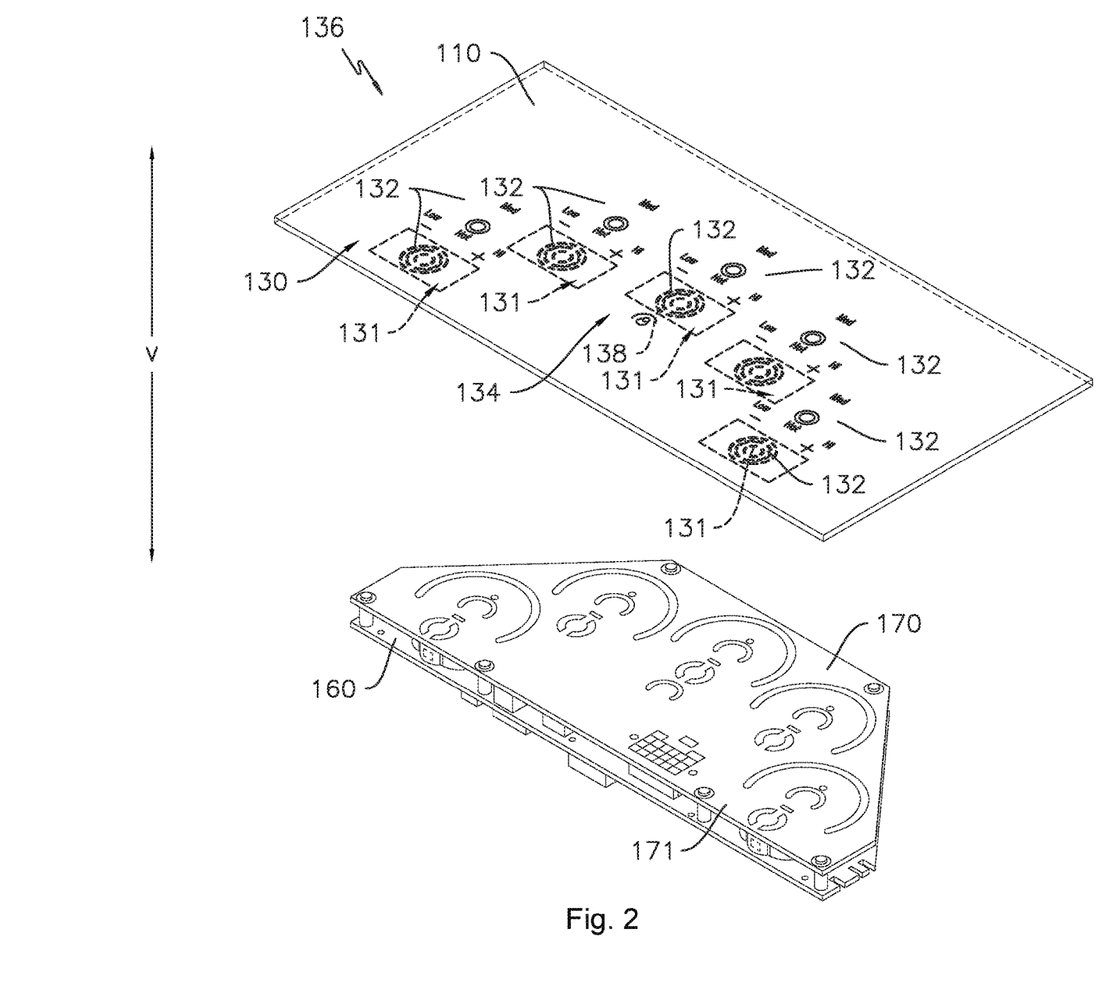
FIG. 2 provides an exploded view of a user interface assembly of the cooktop appliance of FIG. 1.

FIG. 2 illustrates an exploded view of a user interface assembly 136 of cooktop 100. As shown, a user of cooktop appliance 100 may input and receive information regarding the operation of cooktop 100 at touch screen 130, which is a portion of cooking panel 110. A variety of text, digits, and/or symbols may be printed on touch screen 130 to indicate, e.g., the operation of a cooking zone 118 or the area of touch screen 130 to touch to input certain information. In alternative embodiments, no text, digits, or symbols may appear on touch screen 130 unless cooktop 100 is in use.

As shown in FIG. 2, a first printed circuit board 160 is positioned below touch screen 130 along the vertical direction V. A second printed circuit board 170 may be positioned above first printed circuit board 160 but below touch screen 130 along vertical direction V. Second printed circuit board 170 may include a capacitive touch sensing system 171, whereby cooktop 100 is controlled at least in part through touch inputs on touch screen 130 by a user of cooktop 100, e.g., through capacitive touch input components 132.

Referring again to FIG. 1, selection portion 131 may be or may include a capacitive touch input component 132. A touch input component 132 may correspond to a portion of second printed circuit board 170 such that a touch input to selection portion 131 adjacent that portion activates, deactivates, or controls one or more features, functions, or the like of cooktop 100.

More particularly, capacitive touch sensing system 171 of second printed circuit board 170 may be in operative communication with each heating assembly 120 to activate and deactivate heating elements 122, 124, 126 to vary the size and/or power density of each cooking zone 118.

Although described above as utilizing two printed circuit boards 160, 170, in an alternative exemplary embodiment, the elements of the two circuit boards may be combined such that only one printed circuit board is required. For example, user interface assembly 136 may include touch screen 130 and first printed circuit board 160 positioned below touch screen 130 along the vertical direction V. In this exemplary embodiment, first printed circuit board includes capacitive touch sensing system 171 as described above with respect to second printed circuit board 170.

It should be understood that the present disclosure is not limited to the above-described user interface assembly 136; any suitable capacitive-based touch assembly may be utilized for user interface assembly 136. Additionally, it should be understood that the descriptions herein of an appliance are but one example of a possible field of use for the capacitive touch sensors and related methods.

Figure 3:
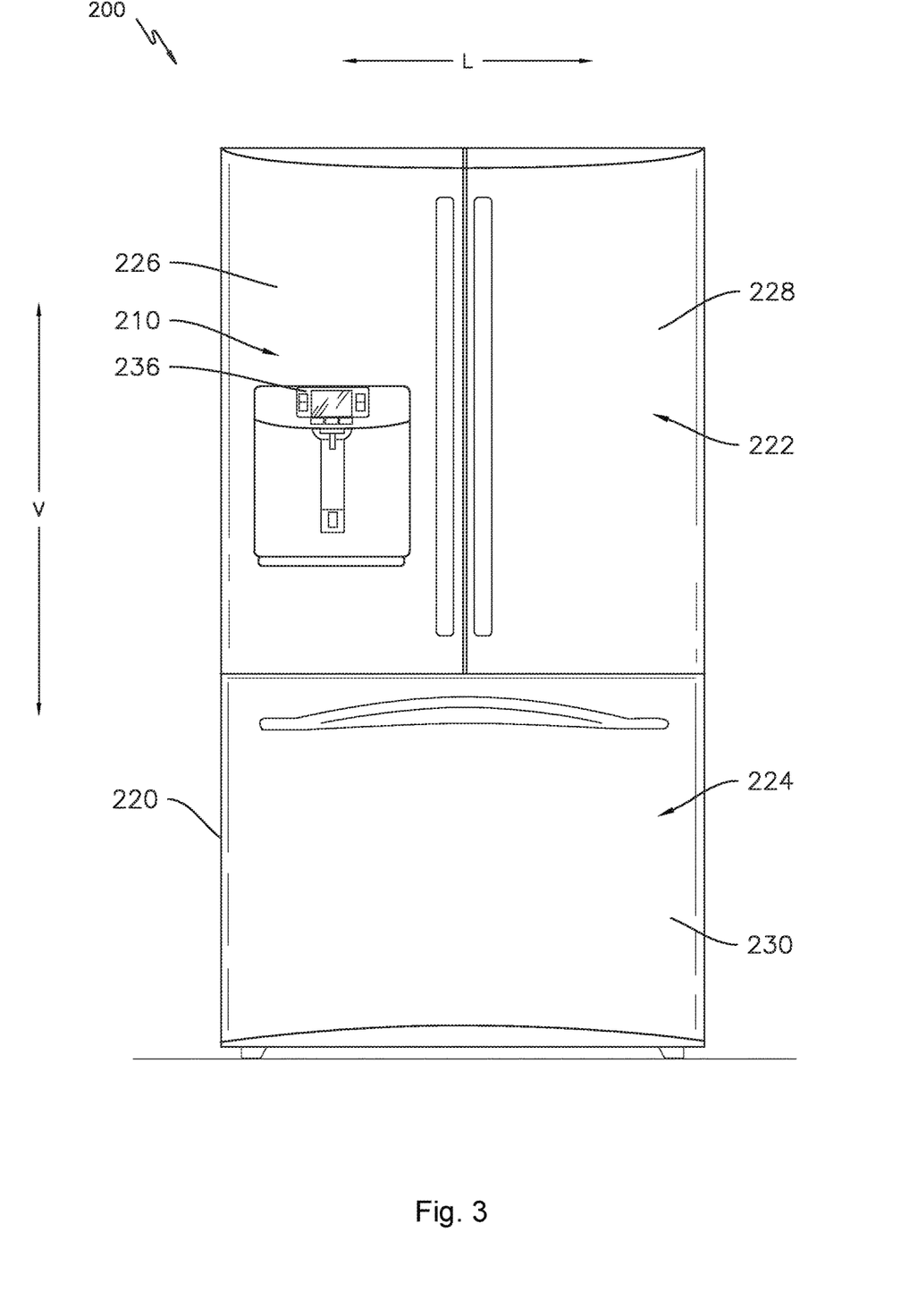
FIG. 3 provides a front, elevation view of a refrigerator appliance as may incorporate a capacitive touch sensor according to at least one embodiment of the present subject matter.

As mentioned above, touch screen 130 may be used with any suitable appliance. For example, one such suitable appliance may be a refrigerator appliance, as illustrated in FIG. 3. FIG. 3 provides a front, elevation view of a refrigerator appliance 200 according to an exemplary embodiment of the present subject matter. Refrigerator appliance 200 defines a vertical direction V and a lateral direction L perpendicular to the vertical direction V.

Refrigerator appliance 200 includes a cabinet or housing 220 that defines chilled chambers for receipt of food items for storage. In particular, refrigerator appliance 200 defines fresh food chamber 222 and a freezer chamber 224 arranged below fresh food chamber 222 along the vertical direction V. As such, refrigerator appliance 200 is generally referred to as a bottom mount refrigerator appliance. However, using the teachings disclosed herein, one of skill in the art will understand that the present subject matter may be used with other types of refrigerator appliances (e.g., side-by-side style or top mount style) or a freezer appliance as well. Consequently, the description set forth herein is for illustrative purposes only and is not intended to limit the present subject matter to any particular style of refrigerator appliance or arrangement of chilled chambers.

Refrigerator doors 226 and 228 are rotatably hinged to an edge of housing 220 for accessing fresh food compartment 222. A freezer door 230 is arranged below refrigerator doors 226 and 228 for accessing freezer chamber 224. Freezer door 230 is coupled to a freezer drawer (not shown) slidably mounted within freezer chamber 224.

Refrigerator appliance 200 also includes a dispensing assembly 210 for dispensing water and/or ice. Dispensing assembly 210 includes a user interface assembly 236 for controlling the mode of operation. For example, user interface assembly 236 includes a water dispensing button (not labeled) and an ice-dispensing button (not labeled) for selecting a desired mode of operation such as crushed or non-crushed ice.

Operation of the refrigerator appliance 200 can be regulated by a controller (not shown in FIG. 3) that is operatively coupled to user interface assembly 236. The controller may be positioned in a variety of locations throughout refrigerator appliance 200. In the illustrated embodiment, the controller may be located within the control panel area of refrigerator door 226. In such an embodiment, input/output ("I/O") signals may be routed between the controller and various operational components of refrigerator appliance 200. The user interface assembly 236 may be in communication with the controller via one or more signal lines or shared communication busses. User interface assembly 236 provides selections for user manipulation of the operation of refrigerator appliance 200 such as e.g., selections between whole or crushed ice, chilled water, and/or other options as well. In response to user manipulation of the user interface assembly 236, the controller operates various components of the refrigerator appliance 200. The controller may include similar features and functionality as described above with respect to controller 140.

An appliance, which in various embodiments may be a cooktop appliance such as cooktop appliance 100 described above, or a refrigerator appliance such as refrigerator appliance 200 described above, or any other suitable appliance where a robust and water-resistant capacitive touch sensor is desired, may include a user interface assembly having a capacitive touch sensor with a driven shield system. The capacitive touch sensor may include an electrode. For example, the capacitive touch sensor may include a sensor pad or pads disposed on a printed circuit board and the electrode may be a ground pour of the printed circuit board surrounding the pad(s). In some embodiments, the ground pour may be hatched. The ground pour may be a ground electrode in that the ground pour may be connected to an electrical ground. The ground pour may also serve as part of the driven shield system, e.g., a shield signal may be supplied to the ground pour to reduce or eliminate false touches, such as may occur when water or other liquid splashes or spills on the user interface assembly or control panel. The shield signal has the same voltage and frequency as a sensor signal supplied to the sensor pad and is in phase with the sensor signal. When the ground pour is coupled to ground and the shield signal is not supplied, the driven shield system is in a LOW state. When the shield signal is supplied to the ground pour, the driven shield system is in an ACTIVE state.

For example, the appliance may include a controller, such as the controller 140 described above, in operative communication with the user interface assembly. The controller may be configured to supply the driven shield signal to the electrode, e.g., ground pour. In some embodiments, the controller may be configured to monitor raw count data from the capacitive touch sensor. The capacitive touch sensor may be operable to convert sensor capacitance into raw digital counts. For example, the capacitive touch sensor may include a dedicated controller (not shown) on-board the printed circuit board which is operable to convert sensor capacitance into raw digital counts. The capacitive touch sensor may further be operable to transmit a signal containing the raw digital counts to the controller. Thus, the controller may monitor the raw count data based on the signals received from the capacitive touch sensor.

Figure 4:
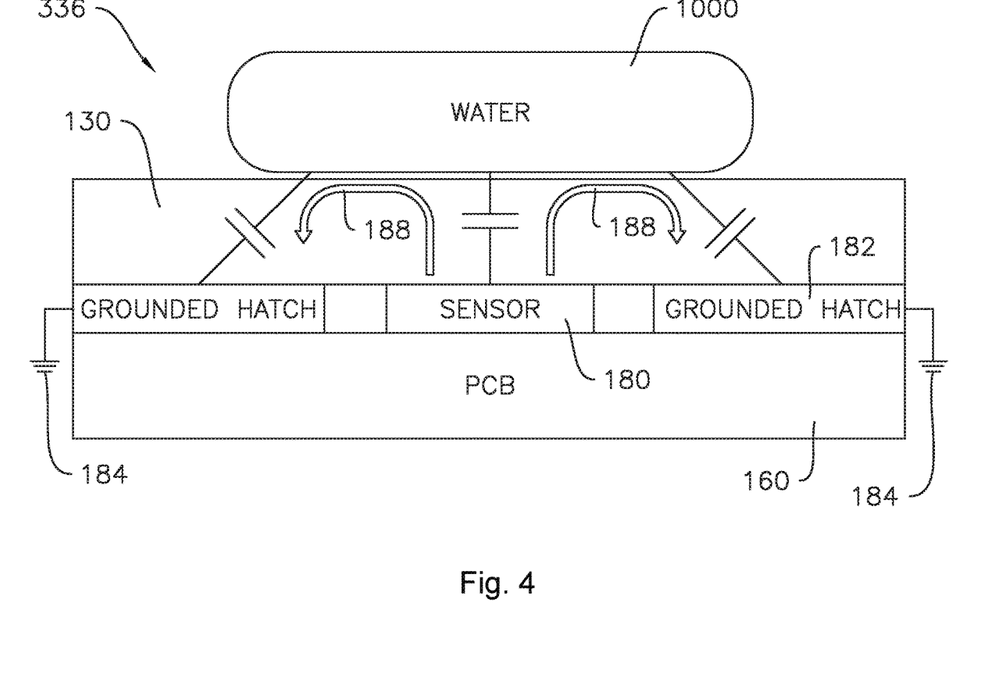
FIG. 4 provides a view of a capacitive touch sensor in a shield LOW state with a liquid in operative communication with the capacitive touch sensor.
Figure 5:
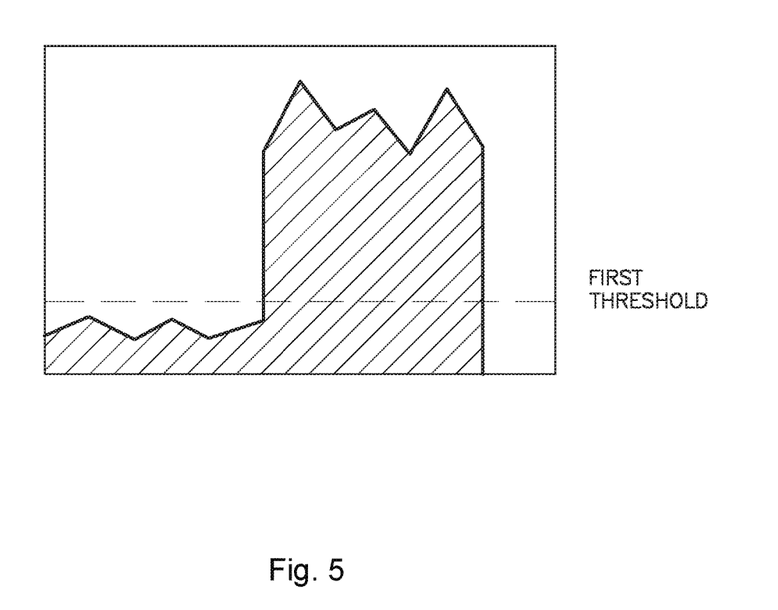
FIG. 5 provides a graphical representation of raw count data associated with the conditions of FIG. 4.

FIG. 4 illustrates an exemplary capacitive touch sensor 336, which may be a user interface assembly or part of a user interface assembly for an appliance, such as user interface assembly 136 of cooktop appliance 100 or user interface assembly 236 of refrigerator appliance 200, or may be any other user interface assembly having a capacitive touch sensor where moisture resistance is desired. As illustrated for example in FIG. 4, the capacitive touch sensor 336 includes a sensor pad 180 on a printed circuit board 160 and a ground electrode 182, e.g., a hatched ground pour of the printed circuit board 160, also referred to as a hatch, with the hatch coupled to ground 184. In FIG. 4, the driven shield system is in a LOW state. FIG. 5 illustrates an exemplary graph of raw count data over time when water or other liquid on the user interface assembly interacts with the capacitive touch sensor 336. As shown in FIG. 5, the presence of the liquid 1000 on the user interface assembly causes the raw count data to exceed a first threshold, which may be a first touch threshold. As indicated by arrows 188 in FIG. 4, sensor pad 180 may be coupled to ground 184 via a liquid 1000 and ground electrode 182 when the shield signal is not supplied.

Figure 6:
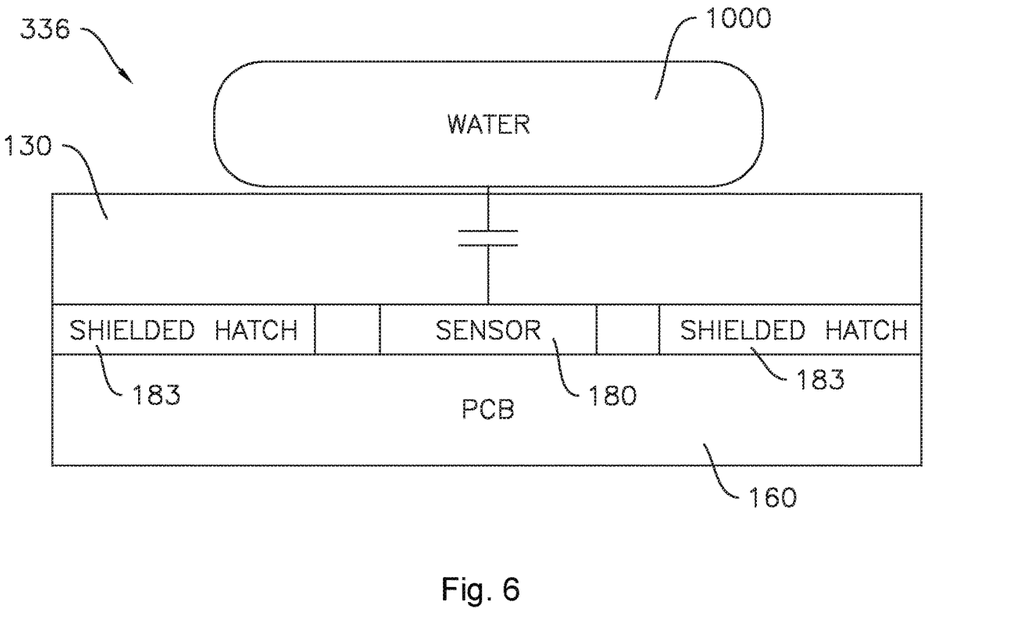
FIG. 6 provides a view of the capacitive touch sensor of FIG. 4 in a shield ACTIVE state.
Figure 7:
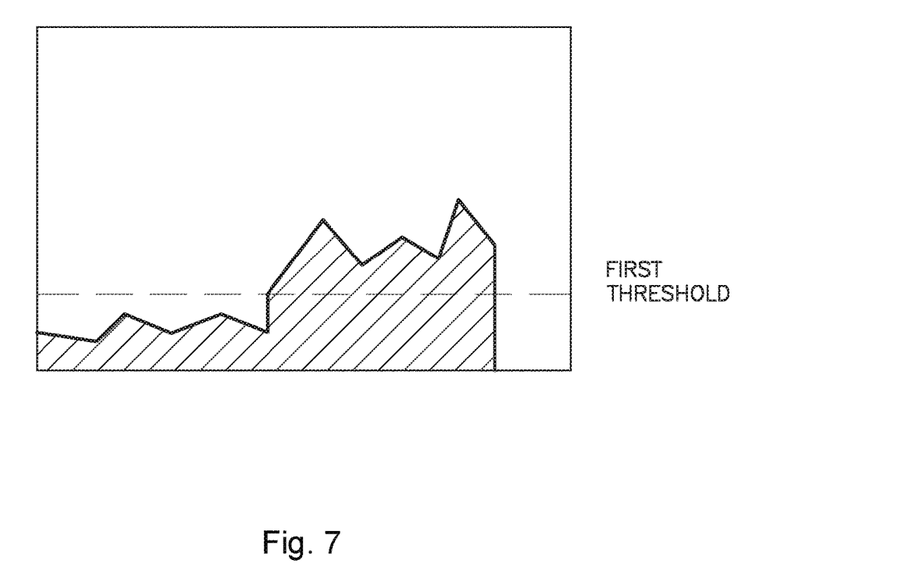
FIG. 7 provides a graphical representation of raw count data associated with the conditions of FIG. 6.

FIG. 6 illustrates the capacitive touch sensor 336 of FIG. 4 with the driven shield in an ACTIVE state, e.g., where a shield signal is supplied to the hatch, such that the hatch operates as a shield electrode 183. As shown in FIG. 6, there is no ground coupling in the presence of liquid 1000 when the shield signal is supplied to the hatch. FIG. 7 illustrates an exemplary graph of raw count data such as may be associated with the conditions illustrated in FIG. 6. As shown in FIG. 7, the total raw count data in the presence of water or other liquid is much lower when the driven shield system is ACTIVE, as compared to the LOW state of the driven shield system illustrated in FIG. 5.

Figure 8:
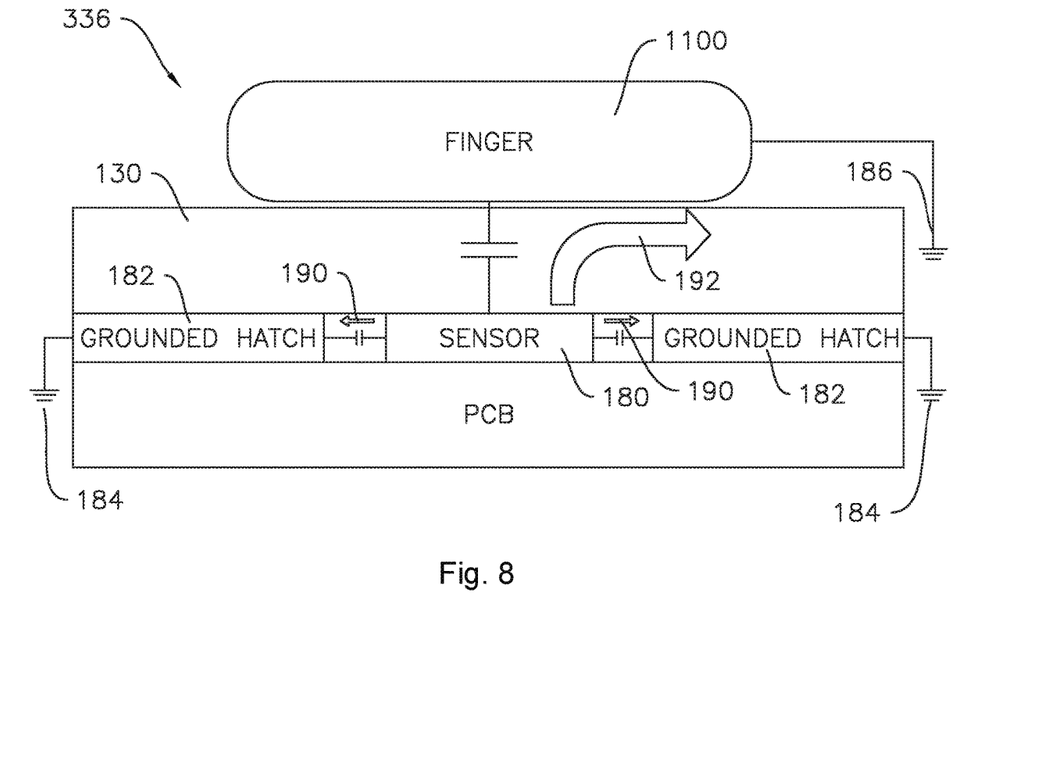
FIG. 8 provides a view of a capacitive touch sensor in a shield LOW state with a user in operative communication with the capacitive touch sensor.
Figure 9:
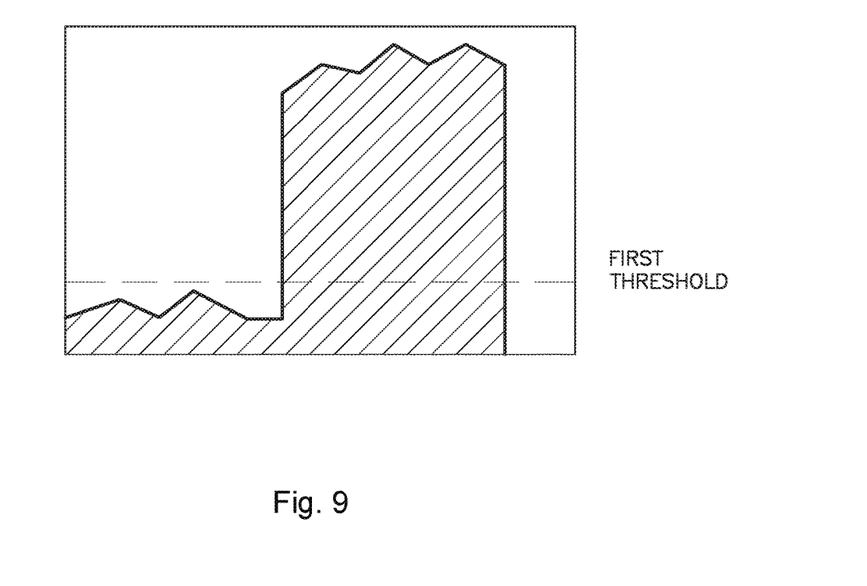
FIG. 9 provides a graphical representation of raw count data associated with the conditions of FIG. 8.

As illustrated in FIGS. 8 and 9, the presence of a user's finger 1100 proximate or in contact with the sensor pad 180 (FIG. 8) provides a corresponding increase in the raw count data (FIG. 9) when the driven shield system is in a LOW state, e.g., where the hatch is coupled to the ground 184 and as such the hatch comprises a ground electrode 182. As indicated by arrows 190 in FIG. 8, sensor pad 180 may be coupled to ground 184 via ground electrode 182, e.g., due to parasitic capacitance between the sensor pad 180 and the hatched ground pour. Additionally, the sensor pad 180 may be coupled to ground at 186 via the user's finger 1100, as indicated by arrow 192 in FIG. 8.

Figure 10:
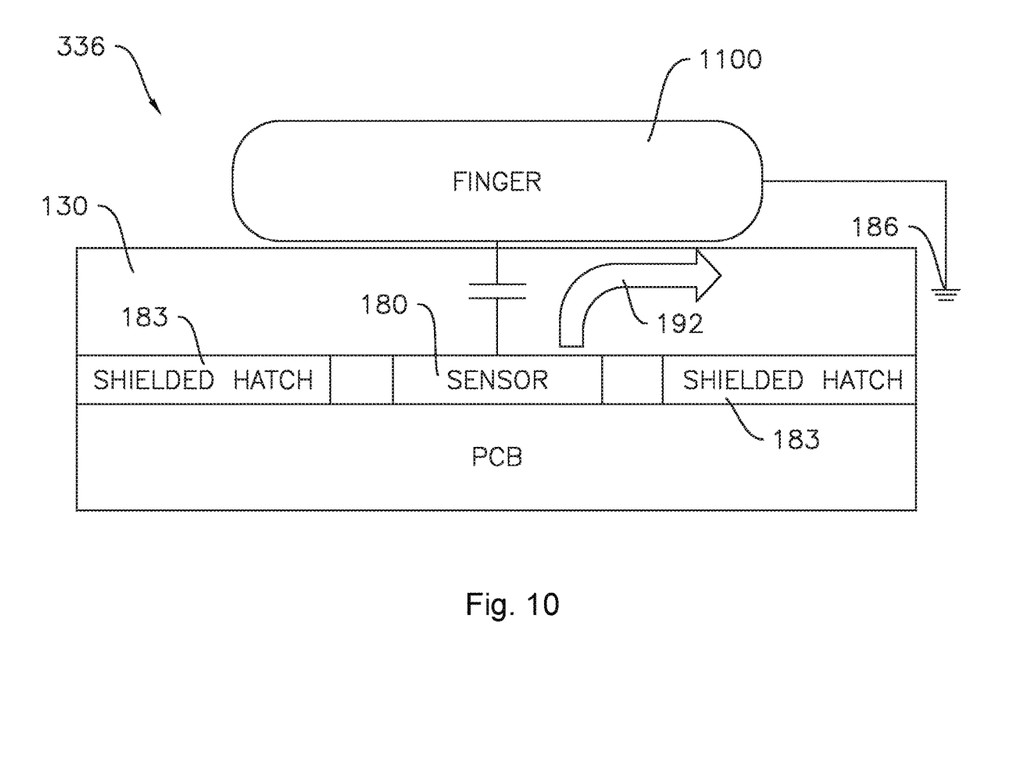
FIG. 10 provides a view of the capacitive touch sensor of FIG. 8 in a shield ACTIVE state.
Figure 11:
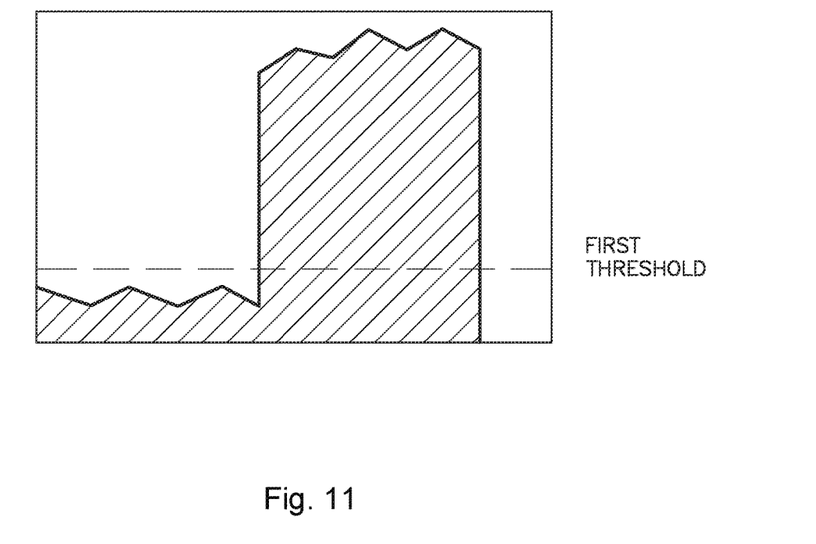
FIG. 11 provides a graphical representation of raw count data associated with the conditions of FIG. 10.

As may be seen in FIG. 10, the sensor pad 180 may be coupled to ground when the user's finger 1100 is present on or near touch screen 130 even while the driven shield is ACTIVE. For example, the sensor pad 180 may still be coupled to ground 186 via user's finger 1100, as indicated by arrow 192 in FIG. 10. As may be seen from comparing the example graph illustrated in FIG. 11 to that of FIG. 9, when the driven shield system is in an ACTIVE state, the raw count data produced in response to the user's finger 1100 decreases only slightly from the raw count data when the driven shield system is in the LOW state, e.g., in contrast to the decrease seen from FIG. 5 to FIG. 7 in the presence of liquid 1000.

Figure 12:
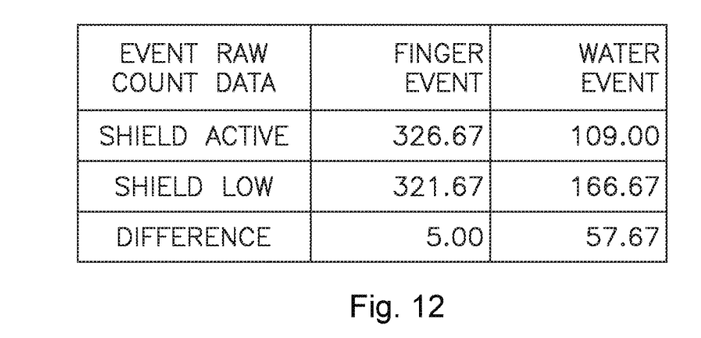
FIG. 12 provides a tabular summary of raw count data as may be associated with the various conditions depicted in FIGS. 4-11.

FIG. 12 provides an exemplary table of raw count data derived from both a finger touch, e.g., FIGS. 8 and 10, and from a water event, e.g., FIGS. 4 and 6, for purposes of illustration. As can be seen from FIGS. 4 through 12, both the water event and the finger touch may cause the raw count data to exceed the first touch threshold. Further, it can be seen that supplying the shield signal to the hatch diminishes the raw count data from the water event significantly more than the difference in raw count data when the driven shield system is activated during a finger touch. For example, as shown in FIG. 12, the difference between ACTIVE and LOW is an order of magnitude greater in a water event than during a finger touch.

Figure 13:
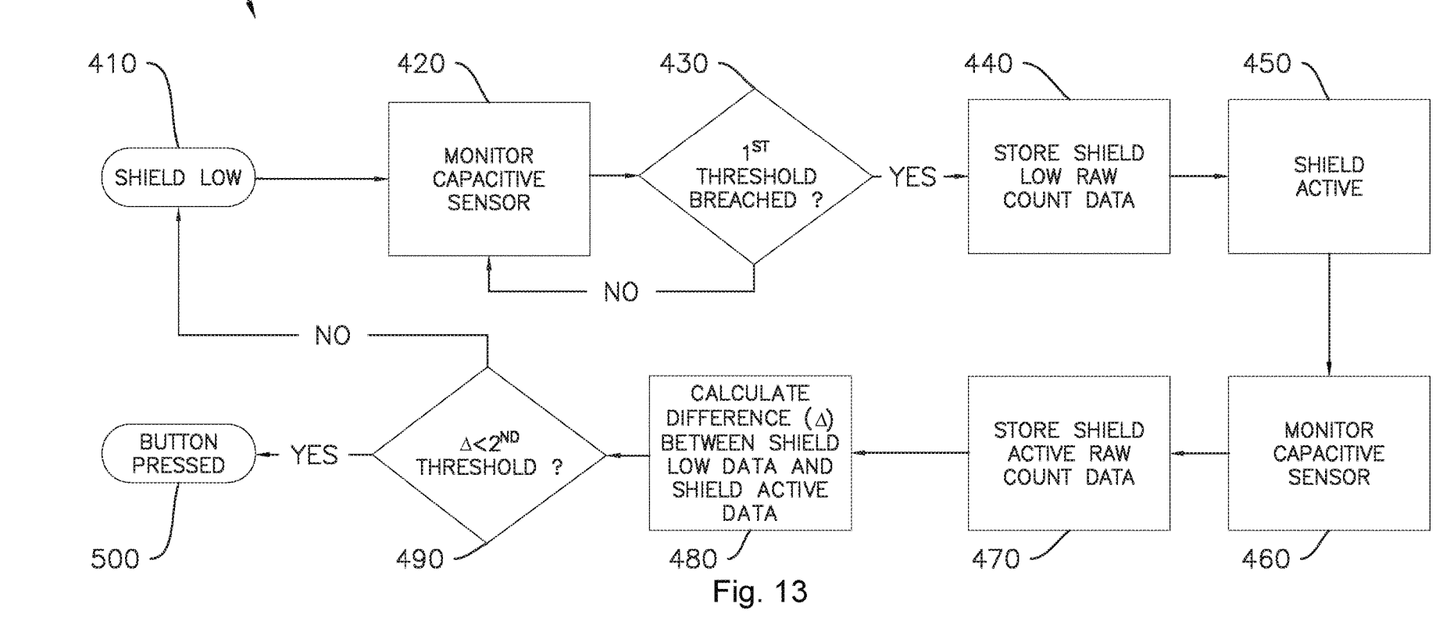
FIG. 13 provides a flow chart illustrating a method of operating a capacitive touch sensor in accordance with at least one embodiment of the present subject matter.

FIG. 13 illustrates an exemplary method 400 of operating a capacitive touch sensor. As illustrated at 410, the driven shield system may be in a LOW state at the start of the method 400. The method may include a step 420 of monitoring raw count data from the capacitive touch sensor and determining at 430 whether a first threshold has been breached. When the raw count data exceeds the first threshold, the method may also record or store a first value of the raw count data, e.g., a LOW raw count data, at step 440. After the raw count data has exceeded or breached the first threshold, method 400 may also include a step 450 activating a driven shield system, e.g., placing the driven shield system in an ACTIVE state. In some embodiments, activating the driven shield system may include supplying a driven shield signal to the ground pour of the printed circuit board of the capacitive touch sensor. When the driven shield system is ACTIVE, e.g., while supplying the driven shield signal to the ground pour, the method 400 may also include a further monitoring step 460 and a step 470 of storing or recording a second value of the raw count data, e.g., an ACTIVE raw count data. Method 400 may further include a step 480 of calculating a difference or delta (Δ) between the first value and the second value. For example, the calculated Δ may be the change in raw count data from FIG. 9 to FIG. 11, e.g., in the case of a finger touch, or, as another example, may be the change in raw count data from FIG. 5 to FIG. 7, e.g., in the case of a liquid event. As noted above, the Δ will be much greater in a water event than during a finger touch. Accordingly, the calculated difference may be compared to a second threshold at step 490, and a touch may be registered at step 500 when the calculated difference between the first value and the second value is less than the second threshold. As seen in FIG. 13, the method 400 may also include returning the driven shield system to the LOW state of step 410 by discontinuing the driven shield signal after calculating the difference between the first value and the second value. Accordingly, the disclosed method 400 minimizes the amount of time that the driven shield system is ACTIVE and consequently minimizes any radiated emissions, while also avoiding false touches in response to a liquid spill on the user interface assembly.

In various embodiments where the capacitive touch sensor is part of an appliance, the method may also include changing an operational parameter of the appliance after registering the touch. For example, where the appliance is a refrigerator 200, the method may further include changing a mode of operation of a dispensing assembly 210 of the refrigerator appliance 200 after registering the touch, e.g., setting the dispensing assembly 210 to dispense whole ice, crushed ice, or water. In another example, where the appliance is a cooktop 100, the method may further include adjusting a heat level of a heating assembly 120 of the cooktop appliance 100 after registering the touch.

In additional embodiments where the capacitive touch sensor is part of an appliance, the method may also include changing an operational parameter of the appliance when the calculated difference between the first value and the second value is greater than the second threshold. Where the calculated difference being greater than the second threshold indicates a possible spill on the touch screen, changing an operational parameter of the appliance in response to the calculated difference being greater than the second threshold may prompt the user to remove the spill which may advantageously provide additional prevention of false touches and/or undesired operation of the appliance. For example, where the appliance is a cooktop 100, the method may include reducing a heat level of a heating assembly 120 of the cooktop appliance 100 when the calculated difference between the first value and the second value is greater than the second threshold. As another example, the method may also or instead include disabling the user interface assembly 136 of the cooktop appliance 100 when the calculated difference between the first value and the second value is greater than the second threshold and re-enabling the user interface assembly 136 of the cooktop appliance 100 once the monitored raw count data drops below the first threshold. For example, the monitored raw count data dropping below the first threshold may indicate that the liquid, and the corresponding potential false touch, has been removed.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance, comprising:
   a user interface assembly comprising a driven shield system and a capacitive touch sensor configured to convert sensor capacitance into raw digital counts and to transmit raw count data, the capacitive touch sensor comprising a sensor pad disposed on a printed circuit board; and
   a controller in operative communication with the user interface assembly, the controller configured to:
   monitor the raw count data transmitted from the capacitive touch sensor while the driven shield system is in a LOW state;
   record a first value of the raw count data when the raw count data exceeds a first threshold while the driven shield system is in the LOW state;
   supply a shield signal to a ground pour of the printed circuit board immediately surrounding the sensor pad, thereby placing the driven shield system in an ACTIVE state, only after the raw count data exceeds the first threshold while the driven shield system is in the LOW state;
   record a second value of the raw count data while supplying the shield signal to the ground pour immediately surrounding the sensor pad, whereby the driven shield system is in the ACTIVE state when the second value of the raw count state is recorded;
   calculate a difference between the first value and the second value; and
   register a touch when the calculated difference between the first value and the second value is less than a second threshold.

2. The appliance of claim 1, wherein the controller is further configured to change an operational parameter of the appliance after registering the touch.

3. The appliance of claim 1, wherein the appliance is a refrigerator and the controller is further configured to change a mode of operation of a dispensing assembly of the refrigerator appliance after registering the touch.

4. The appliance of claim 1, wherein the appliance is a cooktop and the controller is further configured to adjust a heat level of a heating assembly of the cooktop appliance after registering the touch.

5. The appliance of claim 1, wherein the controller is further configured to change an operational parameter of the appliance when the calculated difference between the first value and the second value is greater than the second threshold.

6. The appliance of claim 1, wherein the appliance is a cooktop and the controller is further configured to reduce a heat level of a heating assembly of the cooktop appliance when the calculated difference between the first value and the second value is greater than the second threshold.

7. The appliance of claim 6, wherein the controller is further configured to disable the user interface assembly of the cooktop appliance when the calculated difference between the first value and the second value is greater than the second threshold.

8. The appliance of claim 7, wherein the controller is further configured to re-enable the user interface assembly of the cooktop appliance when the monitored raw count data is less than the first threshold after disabling the user interface assembly of the cooktop appliance.

9. The appliance of claim 1, wherein the controller is further configured to discontinue the shield signal after calculating the difference between the first value and the second value.

10. A method of operating a user interface assembly comprising a driven shield system and a capacitive touch sensor, the capacitive touch sensor comprising a sensor pad disposed on a printed circuit board, the method comprising:
   converting, by the capacitive touch sensor, sensor capacitance into raw digital counts;
   transmitting raw count data from the capacitive touch sensor;
   monitoring the raw count data transmitted from the capacitive touch sensor while the driven shield system is in a LOW state;
   recording a first value of the raw count data when the raw count data exceeds a first threshold while the driven shield system is in the LOW state;
   supplying a shield signal to a ground pour of the printed circuit board immediately surrounding the sensor pad, thereby placing the driven shield system in an ACTIVE state, only after the raw count data exceeds the first threshold while the driven shield system is in the LOW state;
   recording a second value of the raw count data while supplying the shield signal to the ground pour immediately surrounding the sensor pad, whereby the driven shield system is in the ACTIVE state when the second value of the raw count state is recorded;
   calculating a difference between the first value and the second value; and
   registering a touch when the calculated difference between the first value and the second value is less than a second threshold.

11. The method of claim 10, wherein the capacitive touch sensor is a user input component of a user interface assembly of an appliance.

12. The method of claim 11, further comprising changing an operational parameter of the appliance after registering the touch.

13. The method of claim 11, wherein the appliance is a refrigerator, further comprising changing a mode of operation of a dispensing assembly of the refrigerator appliance after registering the touch.

14. The method of claim 11, wherein the appliance is a cooktop, further comprising adjusting a heat level of a heating assembly of the cooktop appliance after registering the touch.

15. The method of claim 11, further comprising changing an operational parameter of the appliance when the calculated difference between the first value and the second value is greater than the second threshold.

16. The method of claim 11, wherein the appliance is a cooktop, further comprising reducing a heat level of a heating assembly of the cooktop appliance when the calculated difference between the first value and the second value is greater than the second threshold.

17. The method of claim 16, further comprising disabling the user interface assembly of the cooktop appliance when the calculated difference between the first value and the second value is greater than the second threshold.

18. The method of claim 17, further comprising re-enabling the user interface assembly of the cooktop appliance when the monitored raw count data is less than the first threshold after disabling the user interface assembly of the cooktop appliance.

19. The method of claim 10, further comprising discontinuing the shield signal after calculating the difference between the first value and the second value.

* * * * *